(12) United States Patent
Wang et al.

(10) Patent No.: US 7,791,406 B1
(45) Date of Patent: Sep. 7, 2010

(54) LOW LEAKAGE POWER MANAGEMENT

(75) Inventors: Bo Wang, Sunnyvale, CA (US);
Yonghua Song, Cupertino, CA (US)

(73) Assignee: Marvell International Ltd. (BM)

( * ) Notice: Subject to any disclaimer, the term of this patent is extended or adjusted under 35 U.S.C. 154(b) by 212 days.

(21) Appl. No.: 11/652,907

(22) Filed: Jan. 11, 2007

Related U.S. Application Data

(60) Provisional application No. 60/788,951, filed on Apr. 4, 2006.

(51) Int. Cl.
*G05F 1/46* (2006.01)

(52) U.S. Cl. .......................... 327/544; 326/34

(58) Field of Classification Search ................ 327/544; 326/26, 33, 34
See application file for complete search history.

(56) References Cited

U.S. PATENT DOCUMENTS

| | | | | |
|---|---|---|---|---|
| 5,644,250 | A * | 7/1997 | Ooishi .......................... 326/16 |
| 6,178,122 | B1 * | 1/2001 | Tomishima et al. ..... 365/189.11 |
| 6,268,741 | B1 * | 7/2001 | Sakata et al. .................... 326/34 |
| 6,414,363 | B1 * | 7/2002 | Mizuguchi .................. 257/394 |
| 6,510,096 | B2 * | 1/2003 | Choi et al. .................... 365/226 |
| 6,747,509 | B2 * | 6/2004 | Horiguchi et al. ........... 327/544 |
| 6,765,429 | B2 * | 7/2004 | Miyagi ....................... 327/534 |
| 6,813,187 | B2 * | 11/2004 | Lee ......................... 365/185.18 |
| 6,876,252 | B2 * | 4/2005 | Kim et al. .................... 327/544 |
| 7,126,370 | B2 * | 10/2006 | Bhattacharya ............... 326/33 |
| 7,142,019 | B2 * | 11/2006 | Mair et al. .................... 326/96 |
| 7,184,354 | B2 * | 2/2007 | Song .......................... 365/229 |
| 7,219,244 | B2 * | 5/2007 | Kuang et al. ................. 713/320 |
| 7,248,522 | B2 * | 7/2007 | Hardee ....................... 365/205 |
| 7,271,615 | B2 * | 9/2007 | Afghahi et al. ............... 326/33 |
| 7,336,103 | B1 * | 2/2008 | Masleid et al. .............. 326/121 |
| 7,391,232 | B1 * | 6/2008 | Bose et al. .................... 326/33 |
| 7,560,976 | B2 * | 7/2009 | Choi et al. ................... 327/534 |
| 7,589,584 | B1 * | 9/2009 | Bui ............................ 327/538 |
| 2004/0080340 | A1 * | 4/2004 | Hidaka ........................ 326/83 |
| 2006/0033525 | A1 * | 2/2006 | Mair et al. .................... 326/33 |
| 2007/0063763 | A1 * | 3/2007 | Yoo et al. .................... 327/544 |
| 2009/0066164 | A1 * | 3/2009 | Flynn et al. .................. 307/112 |

OTHER PUBLICATIONS

ISSCC 2005 / Session 7 / Multimedia Processing / 7.6 International Solid-State Circuits Conference / Digest of Technical Papers / Feb. 7, 2005 / pp. 138-139 and 589.

* cited by examiner

*Primary Examiner*—Lincoln Donovan
*Assistant Examiner*—Thomas J Hiltunen

(57) ABSTRACT

A low leakage power management system is provided. An external voltage domain is selectively coupled to the internal voltage domain of an integrated circuit according to demand for the functions provided by the integrated circuit. An external voltage $V_{DD}$ is connected to the internal supply voltage plane of the integrated circuit when the integrated circuit is active. The external supply voltage $V_{DD}$ is disconnected from the integrated circuit chip during idle periods. A plurality of switch cells may be provided for connecting the external voltage $V_{DD}$ to the integrated circuit. A multi-step sequence is provided for connecting the external supply voltage $V_{DD}$ to the chip's internal supply voltage plane to prevent excessive current from flowing through any individual switch cell.

22 Claims, 10 Drawing Sheets

LOW LEAKAGE POWER MANAGEMENT

RELATED APPLICATIONS

This application claims the benefit of U.S. Provisional Application No. 60/788,951 filed Apr. 4, 2006, which is incorporated herein by reference.

TECHNICAL FIELD

This disclosure relates to low leakage power management for integrated circuit chips.

BACKGROUND

Managing power consumption is an important aspect of designing electronic devices. Minimizing the power consumed by individual components within an electronic device results in less heating and a lower draw on the device power supply. This can result in more satisfactory performance, a longer operational lifetime and, in the case of portable devices, longer battery life.

Leakage currents in integrated circuits provide an undesirable drain on an electronic device's power supply. Managing low level leakage currents is an effective step in minimizing unwanted power consumption in electronic devices. One method for managing low level leakage is to disconnect integrated circuits from the device power supply during periods of inactivity when the logical functions of the integrated circuit are not required. Often there are significant periods of time during the normal operation of electronic devices in which various components, including integrated circuit chips, are not in use. High level leakage can be completely eliminated from an integrated circuit chip during dormant periods by simply cutting the power supplied to the integrated circuit chip. Power may be restored to the integrated circuit chip when the operation of the device in which the chip is installed again requires the logical functions provided by the integrated circuit chip.

However, implementing a power management regimen that includes disconnecting the power to an integrated circuit chip during periods of dormancy, and reconnecting power in advance of active periods, raises a number of problems that must be addressed. For example, very large-scale integrated circuit chips often include multiple power connections in order to evenly distribute the current flowing into the logic circuits contained on the integrated circuit chip. A low leakage power management system must be capable of switching each power connection in a controlled manner to ensure that excessive in-rush currents are prevented on individual power connections. Care must also be taken when disconnecting the power supplied to the integrated circuit chip in order to prevent unpredictable intermediate voltages on the integrated circuit chip's internal supply voltage bus from generating false or otherwise improper output signals.

BRIEF SUMMARY

The present invention is defined by the following claims, and nothing in this section should be taken as a limitation on those claims. By way of introduction, the preferred embodiments described below provide systems and methods for low leakage power management in integrated circuits. High leakage currents are eliminated by implementing a "sleep mode" of operation in which power is disconnected from an integrated circuit chip during idle periods when the logic functions performed by the integrated circuit chip are not required by the system in which the integrated circuit chip is installed. A low leakage power management system governs the process of disconnecting an external supply voltage from the integrated circuit chip when the chip enters sleep mode, and re-connecting the external supply voltage when the chip exits sleep mode. In other aspects, methods are disclosed for implementing a low leakage power management program, including methods for disconnecting an external supply voltage from an integrated circuit to enter sleep mode, and a multi-stage method for reconnecting the external supply voltage to the integrated circuit when exiting sleep mode.

According to one embodiment a switch cell is provided for selectively coupling an external voltage domain to an internal voltage domain of an integrated circuit chip. The switch cell includes a power switch for selectively coupling an external supply voltage to an internal supply voltage plane of the integrated circuit chip, and a pull down switch for selectively coupling the internal supply voltage plane to a logic common voltage plane. A sleep signal controls the power switch so that the external supply voltage may be decoupled from the internal supply voltage plane during periods of inactivity when the logic circuits on the integrated circuit chip are not in use. A pull down signal controls the pull down switch so that the pull down switch is closed when the power switch is open.

In another embodiment a method of managing low leakage power in an integrated circuit chip is provided. The method includes de-coupling an external supply voltage from an internal supply voltage plane of the integrated circuit chip in response to a sleep signal and coupling the internal supply voltage plane to a logic common voltage plane of the integrated circuit chip in response to a pull down signal. The sleep signal is asserted during periods of inactivity when the integrated circuit chip is not in use. The sleep signal is de-asserted during active periods when the logic functions of the integrated circuit are required by the system in which the integrated circuit chip is installed. The method further includes coordinating the sleep signal and the pull down signal so that the internal supply voltage plane is coupled to the logic common plane when the external supply voltage is de-coupled from the internal supply voltage plane.

In another embodiment, a system is provided for controlling a multi-phase power-up sequence for providing power to an integrated circuit chip. The system includes a state machine adapted to initiate control signals. A plurality of switch cells couple an external supply voltage to the internal power domain of an integrated circuit chip. The plurality of switch cells couple the external supply voltage to the internal power domain in a sequential manner in response to at least one of the control signals.

In another embodiment a method is provided for controlling a multi-phase power up sequence for providing power to an integrated circuit chip. According to this method a first signal is propagated along a plurality of sequentially linked switch cells. A first current is allowed to flow into the integrated circuit chip in response to the first signal. A second signal is propagated along the plurality of sequentially linked switch cells after the first signal has propagated through the switch cells. A second current is allowed to flow into the integrated circuit chip in response to the second signal propagating along the plurality of sequentially linked switch cells.

Yet another embodiment relates to a switch cell circuit for selectively coupling an external supply voltage to an integrated circuit chip. The switch cell circuit includes a sleep signal buffer. The sleep signal buffer is adapted to receive a sleep signal and output a corresponding sleep signal after a delay. The switch cell also includes a power circuit for connecting the external supply voltage to the integrated circuit.

The power circuit includes a power switch and a pull down switch. The power switch responds to the received sleep signal such that the power switch is non-conducting when the received sleep signal is asserted and conducting when the received sleep signal is de-asserted. The pull down switch responds to a pull down signal such that the pull down switch is conducting when the pull down signal is asserted and non-conducting when the pull down signal is de-asserted.

Another embodiment provides a method of selectively decoupling and coupling an external supply voltage to an integrated circuit chip. A sleep signal is asserted in order to decouple the external supply voltage from the integrated circuit chip. The asserted sleep signal is propagated to a plurality of sequentially linked switch cells. The asserted sleep signal is buffered in each sequentially linked switch cell such that the asserted sleep signal is returned from the last of the sequentially linked switch cells after a cumulative buffering delay. The method further calls for decoupling the external supply voltage from an internal supply voltage plane of the integrated circuit chip in each of the plurality of sequentially linked switch cells in a sequential manner in response to the asserted sleep signal. After the asserted sleep signal is returned from the last sequentially linked switch cell, a pull down signal is asserted. The asserted pull down signal is propagated to the sequentially linked switch cells. The internal supply voltage plane of the integrated circuit chip is coupled to a logic common voltage plane on the integrated circuit chip in response to the asserted pull down signal in each sequentially linked switch cell. With the switch cells in this state the external supply voltage is completely decoupled from the integrated circuit chip. In order to couple the external supply voltage to the integrated circuit chip, the method calls for deasserting the pull down switch signal. The deasserted pull down switch signal is propagated to the sequentially linked switch cells, and returned from the last sequentially linked switch cell after a propagation delay. When the deasserted pull down signal is received at the sequentially linked switch cells the method calls for sequentially decoupling the internal supply voltage plane of the integrated circuit chip from the logic common voltage plane of the integrated circuit chip in each of the plurality of sequentially linked switch cells. The sleep signal is deasserted after the deasserted pull down signal is returned from the last sequentially linked switch cell. The de-asserted sleep signal is then propagated to the sequentially linked switch cells. Finally, the external supply voltage is coupled to the internal supply voltage plane of the integrated circuit chip in each of the plurality of sequentially linked switch cells in a sequential manner in response to the deasserted sleep signal.

In yet another embodiment a switch cell circuit for selectively coupling an external supply voltage to an integrated circuit chip is provided. The switch cell circuit includes a power circuit for coupling the external supply voltage to the integrated circuit chip and an inverter circuit for driving the power circuit. The inverter circuit provides a multi-level voltage signal to the power circuit such that the power circuit takes on one of a plurality of different states corresponding to a particular stage of a multi-stage power-up sequence.

In still another embodiment a method of providing a multi-stage power-up sequence for an integrated circuit chip is provided. This method calls for providing a first voltage level from the external supply voltage to the integrated circuit chip in a first stage. A second voltage level is provided from the external supply voltage to the integrated circuit chip in a second stage. The first stage precedes the second stage and the second voltage level is greater than the first voltage level.

The preferred embodiments will now be described with reference to the attached drawings.

DETAILED DESCRIPTION OF THE DRAWINGS AND THE PRESENTLY PREFERRED EMBODIMENTS

The present invention relates to low leakage power management for integrated circuits. According to one embodiment of the invention, an external voltage domain or an external supply voltage $V_{DD}$ is selectively connected and disconnected from the internal voltage domain, or supply voltage $V_{DDV}$ plane of an integrated circuit chip. The external voltage is selectively connected to and disconnected from the internal voltage domain according to the demand for the logic functions provided by the integrated circuit chip. The external supply voltage $V_{DD}$ is connected to the internal voltage domain during active periods when the logic circuits of the integrated circuit chip are needed by the larger system in which the integrated circuit chip is installed. The external supply voltage $V_{DD}$ is disconnected from the integrated circuit chip during idle periods in which the logic circuits are not required by the larger system. A switch cell is included for connecting the external supply voltage $V_{DD}$ to the chip's internal voltage supply plane. A multiplicity of switch cells may be provided for connecting the external supply voltage $V_{DD}$ to the chip's internal supply voltage plane at multiple different locations. A multi-step sequence for connecting the external supply voltage $V_{DD}$ to the chip's internal supply voltage plane may be used to prevent excessive current from flowing through any individual switch cell.

Figure 1:
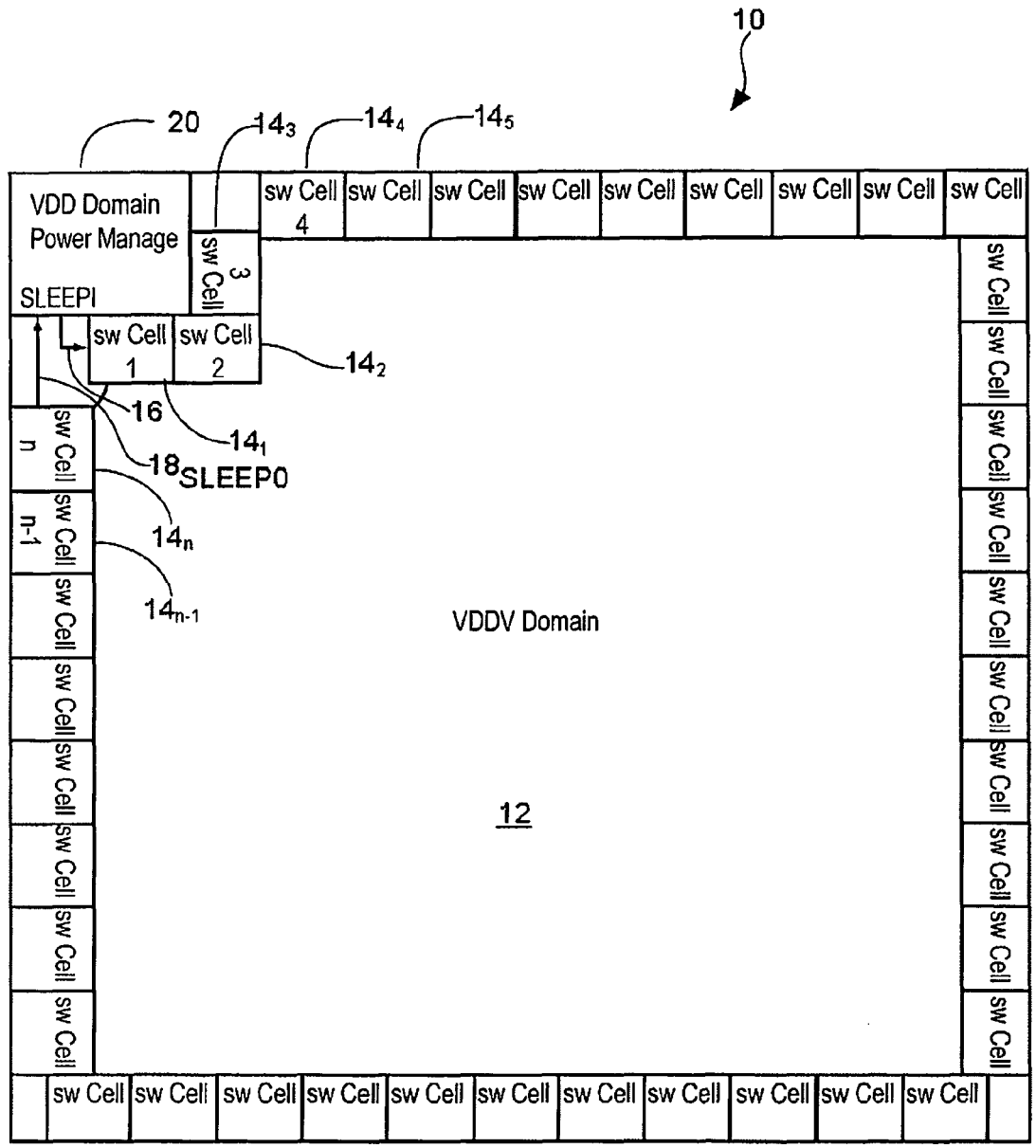
FIG. 1 is a floor plan of an integrated circuit chip incorporating an embodiment of a low leakage power management system.

FIG. 1 shows the floor plan of an integrated circuit chip incorporating a low leakage power management system. An integrated circuit chip 10 comprises a logic core 12 that includes all of the logic circuits for performing the logic functions required of the integrated circuit chip 10. A plurality of switch cells $14_1, 14_2, 14_3 \ldots 14_n$ are arrayed around the outer periphery of the logic core 12. The switch cells $14_1$-$14_n$ are provided to connect and disconnect an external supply voltage $V_{DD}$ to an internal supply voltage plane for supplying power to the logic circuits in the logic core 12. The number of switch cells $14_1$-$14_n$ provided to connect the external supply voltage to the logic core 12 may depend on the size of the integrated circuit chip 10. For example, a very large scale integrated circuit may require two thousand or more switch cells $14_1$-$14_n$ to connect the external supply voltage $V_{DD}$ to the internal supply voltage plane of the integrated circuit chip 10. A power management module 20 is provided for controlling the switch cells $14_1$-$14_n$ and managing the power delivered to the logic core 12.

Figure 2:
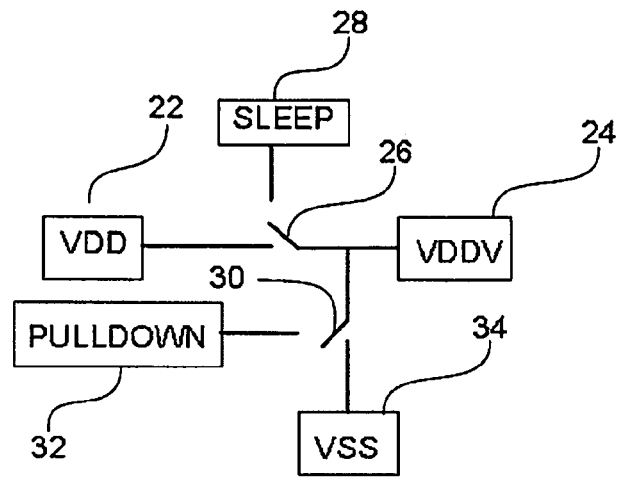
FIG. 2 is a simplified diagram of a switch cell circuit according to an embodiment of the invention.

FIG. 2 is a simplified circuit diagram of a switch cell $14_i$ for connecting the external supply voltage $V_{DD}$ to the internal supply voltage plane $V_{DDV}$ of an integrated circuit chip. A power switch 26 is provided to connect the external supply voltage $V_{DD}$ to the internal supply voltage plane of the $V_{DDV}$ domain. When the power switch 26 is closed, the external supply voltage $V_{DD}$ 22 is connected to the internal supply voltage plane in the $V_{DDV}$ domain 24. When the power switch 26 is open, the external supply voltage $V_{DD}$ 22 is disconnected from the internal supply voltage plane and power is cut-off from the $V_{DDV}$ domain 24. The power switch 26 is controlled by a SLEEP signal 28. A pull down switch 30 may also be provided. The pull down switch 30 couples the internal supply voltage plane to logic common $V_{SS}$ 34. Thus, when the pull down switch 30 is closed, the supply voltage provided to the logic circuits in the $V_{DDV}$ domain 24 is pulled down to logic common $V_{SS}$ 34. In order to prevent a short circuit between the external supply voltage $V_{DD}$ and logic common, the pull down switch 30 is only closed after the power switch 26 has been opened. Conversely, the pull down switch 30 is opened before the power switch 26 is closed. Pulling the internal supply voltage $V_{DDV}$ 24 down to logic common $V_{SS}$ 34 when the power switch 26 is open prevents unpredictable intermediate voltage levels on the chip's internal supply voltage plane, thereby preventing unpredictable output events due to uncertain intermediate voltages driving the logic circuits in the $V_{DDV}$ domain 24. The power switch 26 opens when the SLEEP signal 28 is asserted (logic high) and closes when the SLEEP signal 28 is de-asserted (logic low). The pull down switch 30 operates in a similar fashion, but in reverse. The pull down switch 30 closes when the pull down signal 32 is asserted and opens when the pull down signal 32 is de-asserted.

Figure 3:
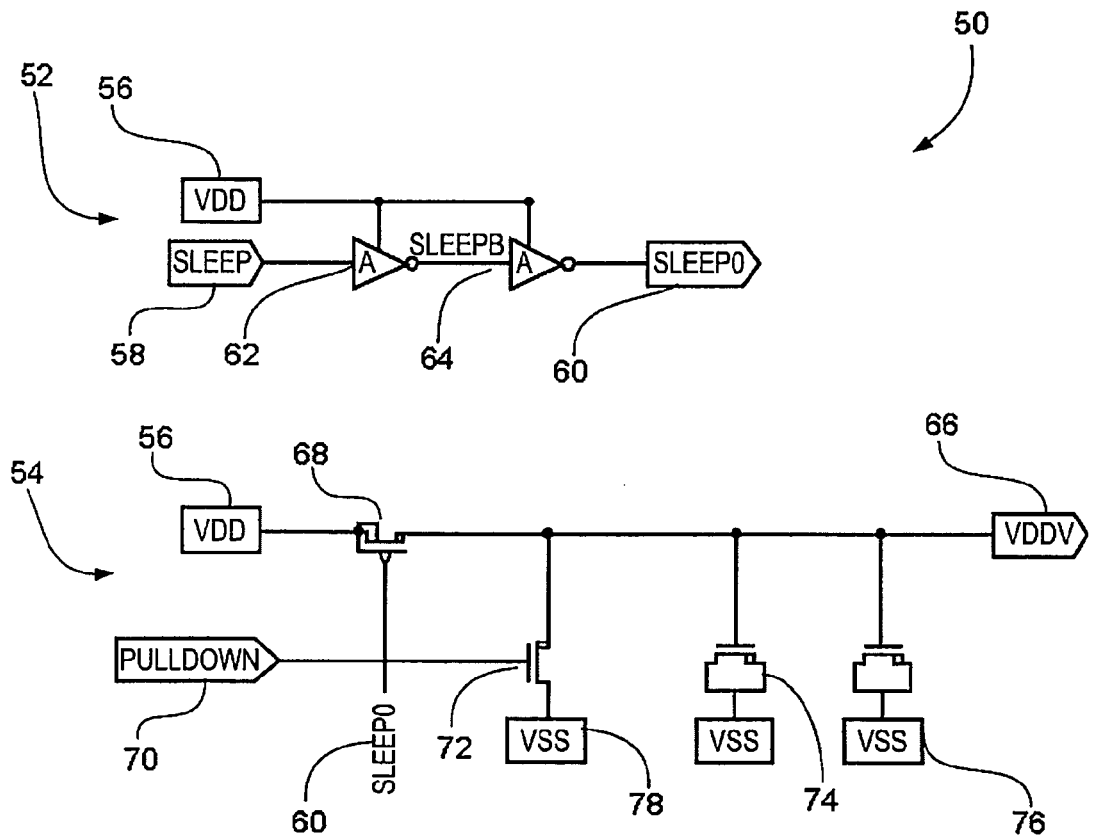
FIG. 3 is a detailed schematic diagram of a switch cell circuit according to an embodiment of the invention.

FIG. 3 shows a more detailed schematic diagram of a switch cell 50 according to an embodiment of the invention. The switch cell 50 includes a SLEEP signal buffer circuit 52 and a power circuit 54. The SLEEP signal buffer circuit 52 receives the SLEEP signal 58 from an external source such as the power management module 20 (FIG. 1), another switch cell, or some other source. The SLEEP signal buffer circuit 52 comprises a pair of series connected inverters 62, 64. The inverters 62, 64 are biased by the external supply voltage $V_{DD}$ 56. The first inverter 62 reverses the state of the input SLEEP signal 58, providing a $\overline{\text{SLEEP}}$ signal. The second inverter 64 reverses the state of the inverted $\overline{\text{SLEEP}}$ signal, the output of the second inverter 64 provides a SLEEPO signal 60 corresponding to the original state of the SLEEP signal 58 input to the SLEEP signal buffer circuit 52. A slight delay is introduced by the buffering process.

The power circuit 54 couples an external power supply 56 to the $V_{DDV}$ domain 66. A PMOS power switch 68, or any other suitable switching device, couples the external supply voltage $V_{DD}$ 56 to the internal supply voltage plane 66 of the $V_{DDV}$ domain. The gate of the PMOS power switch 68 is driven by the SLEEPO signal 60 output by the SLEEP signal buffer circuit 52. An NMOS pull down switch 72 is provided between the internal supply voltage plane of the $V_{DDV}$ domain 66 and logic common $V_{SS}$ 78. The gate of the NMOS pull down switch 72 is driven by an external pull down signal 70. Capacitors 74, 76 are provided to filter the internal supply voltage plane of the $V_{DDV}$ domain.

With regard to the switch cell circuits shown in FIGS. 2 and 3, the SLEEP signal determines whether the external supply voltage $V_{DD}$ is coupled to the internal supply voltage plane of the $V_{DDV}$ domain on the integrated circuit chip. In other words, the SLEEP signal determines whether the logic circuits in the $V_{DDV}$ domain will be energized. As mentioned with regard to FIG. 1, the SLEEP signal may be asserted and de-asserted by a power management module 20 associated with the integrated circuit chip 10. The individual switch cells $14_1, 14_2, \ldots 14_n$ may be connected in a "daisy-chain" configuration in which an initial SLEEP signal, SLEEPI, issues from the power management module 20 and is input to the SLEEP signal buffer circuit of the first switch cell $14_1$. The output of the first switch cell SLEEP signal buffer circuit is input to the SLEEP signal buffer circuit of the second switch cell $14_2$ and so on around the entire periphery of the integrated circuit chip 10. The output of the SLEEP signal buffer circuit of the last switch cell $14_n$ returns the SLEEP signal to the power management module 20 as the SLEEPO signal 18. Thus, changes in the logical state of the SLEEP signal are propagated to all of the switch cells and returned to the power management module 20.

The power management module 20 may monitor the status of a power-on or power-off sequence by monitoring the progress of various SLEEP signal state changes as they propagate around the chip 10 to the switch cells $14_1$-$14_n$ and are returned to the power management module 20. For example, if the power management module 20 changes the state of the SLEEP signal input to the SLEEP signal buffer circuit of the first switch cell $14_1$, the power management module 20 can be made to monitor the SLEEPO signal output from the SLEEP signal buffer circuit of the last switch cell $14_n$. When a state change corresponding to a state change initiated on the SLEEPI signal 16 by the power management module 20 and input to the first switch cell $14_1$, appears on the SLEEPO signal 18 output from the last switch cell $14_n$, the power management module 20 can be certain that the state change has propagated to all of the switch cells connected around the periphery of the integrated circuit chip 10. It can be presumed that each switch cell has responded to the SLEEP signal state change in an appropriate manner (i.e., opening or closing the power switch or the like), and that a corresponding state in the power-up or power-down sequence has been completed. The SLEEPO signal output from the SLEEP signal buffer circuit of the last switch cell $14_n$ may be input to a counter, a flip-flop, or some other memory device for storing state information relating to the power-up or power-down sequence. Such a state machine may be employed to initiate additional control signals for advancing a multi-stage power-up or power-down sequence.

As an example, assume that the outputs of each switch cell power circuit are connected to various points on a common internal voltage supply bus on the integrated circuit chip. As mentioned earlier with regard to the simplified switch cell circuit of FIG. 2, the power switch 26 of a switch cell should be open before closing the pull down switch 30 to prevent short circuiting the external supply voltage $V_{DD}$ directly to the integrated circuit chip's logic common $V_{SS}$ 34. Since the power switches of all of the switch cells connect to the same internal supply voltage plane, the power switches of all of the switch cells are open before the pull down switch of any switch cell is closed. When power is applied to the logic core of the integrated circuit chip, the power management module 20 may assert the SLEEP signal in order to disconnect the supply voltage $V_{DD}$ from the $V_{DDV}$ domain. The SLEEP signal transitions from a logic low state to a logic high state. This state transition is propagated to the first switch cell 14$_1$ and then from one switch cell to the next to the next until it returns to the power management module 20 as the SLEEPO signal. The switch cells respond to the change in the state of the SLEEP signal by opening their respective power switches. When the state transition has propagated to all of the switch cells, the power switches in all of the switch cells will have opened, and the supply voltage $V_{DD}$ is completely disconnected from the integrated circuit's internal supply voltage plane. Once $V_{DD}$ is disconnected, it is safe to close the pull down switches in all of the switch cells in order to drain any residual voltage that may remain on the internal supply voltage plane. Thus, when the state transition is reflected in the SLEEPO signal output from the last switch cell, the power management module 20 may trigger the closing of the pull down switches in all of the switch cells. Again, the pull down signal is propagated to all of the switch cells around the periphery of the chip 10. This time around, when the pull down signal transition is registered back at the power management module 20, all of the pull down switches will have been closed and the power-down sequence is complete. The integrated circuit may remain in this "SLEEP mode" until a "wake-up" sequence for restoring power to the integrated circuit chip is initiated. The "wake-up" or power-up sequence may require opening the pull down switches and closing the power switches of the various switch cells in a sequential manner similar to the power-down sequence just described except that the pull down switches are all opened before closing the power switches.

Figure 4:
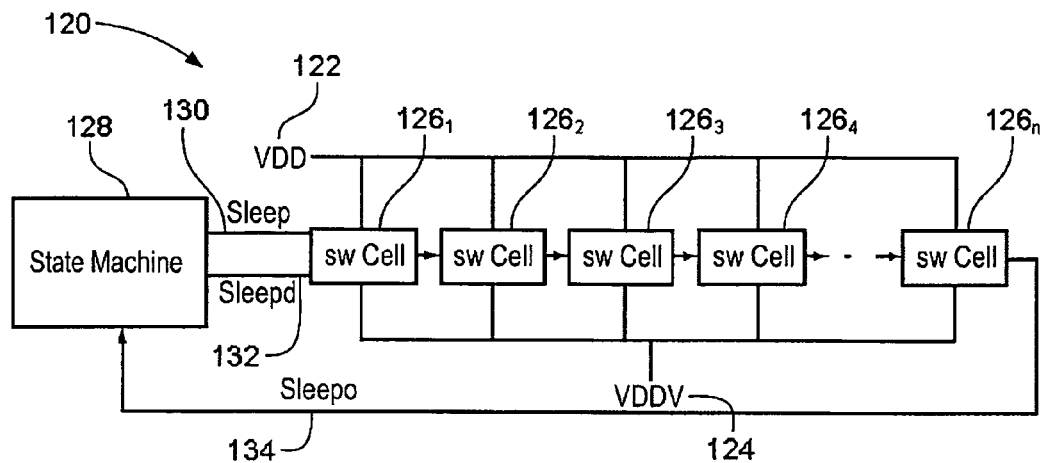
FIG. 4 is a block diagram of an embodiment of a low leakage power management system for providing a multi-stage power-up sequence for providing power to an integrated circuit chip.

FIG. 4 shows a block diagram of a low leakage power management system 120 according to another embodiment of the invention. The power management system 120 implements a two-step approach for "waking" an integrated circuit from a SLEEP mode. As has been described, the power management system 120 couples an external supply voltage $V_{DD}$ 122 to the internal supply voltage plane $V_{DDV}$ 124 of an integrated circuit chip. The external supply voltage $V_{DD}$ 122 is coupled to the internal supply voltage plane $V_{DDV}$ 124 via a plurality of switch cells 126$_1$, 126$_2$, 126$_3$, ... 126$_n$. A state machine 128 initiates various SLEEP signals which are passed along in a serial manner from one switch cell to the next until the last switch cell 126$_n$ returns the propagated signals back to state machine 128. In the example shown, the state machine 128 outputs two signals, SLEEP 130 and SLEEPD 132, corresponding to a two-stage power-up sequence. A two-stage power-up sequence may include, for example, a first stage in which the power switches in the switch cells are partially closed or otherwise limiting the current that is allowed to flow from the external voltage supply $V_{DD}$ 122 to the logic circuits in the chip's logic core. A second stage may include fully closing the power switches or otherwise providing unrestricted current flow into the logic core.

In this case, the power-up sequence begins with the integrated circuit chip in the SLEEP mode. The power switch in each switch cell is fully open and the external supply voltage $V_{DD}$ 122 is completely isolated from the logic core. The state machine 128 initiates the wake-up sequence by de-asserting the SLEEP signal 130. The power switch in the first switch cell 126$_1$ responds to the de-asserted SLEEP signal by partially coupling the external supply voltage $V_{DD}$ 122 to the internal supply voltage plane $V_{DDV}$ 124 in a manner that limits the flow of current to the logic core of the integrated circuit chip of the integrated circuit. Current flow may be limited by applying less than the full supply voltage $V_{DD}$ 122 to the internal supply voltage plane or by applying the full supply voltage while limiting the current allowed to flow through the switch cell, or some other current limiting mechanism that prevents a large current spike from flowing through the switch cell to the logic core.

The de-asserted SLEEP signal 130 propagates through all of the switch cells 126$_1$-126$_n$. In each switch cell the power switch partially couples the external supply voltage $V_{DD}$ 122 to the internal supply voltage plane $V_{DDV}$ 124 of the integrated circuit chip, limiting the in-rush current allowed to flow into the logic core as the integrated circuit chip is powered up. The de-asserted SLEEP signal 130 returns to the state machine 128 as the SLEEPO signal 134 output from the last switch cell 126$_n$. The state machine 128 receives the de-asserted SLEEPO 134 signal from the last switch cell 126$_n$ knowing that the first stage of the power-up sequence is complete. After receiving the SLEEPO signal 134, the state machine 128 de-asserts the SLEEPD signal 132. The first switch cell 126 receives the SLEEPD signal 132 and fully couples the external supply voltage $V_{DD}$ 122 to the internal supply voltage plane $V_{DDV}$ 124. In other words, the first switch cell 126 applies the full external supply voltage $V_{DD}$ 122 to the internal supply voltage plane $V_{DDV}$ 124 of the integrated circuit chip and current is allowed to flow into the logic core substantially without restriction. Again, the de-asserted SLEEPD signal propagates through all of the switch cells, fully closing each power switch along the way. The power-up sequence is complete when the power switch in the last switch cell 126$_n$ is fully closed. The de-asserted SLEEPD signal 132 may be returned to the state machine 128 in a manner similar to the SLEEPO signal 134 to confirm successful completion of the power-up sequence. If desired, the low leakage power management system 120 may be modified to provide a multi-stage power-up sequence having more than two stages.

Figure 5:
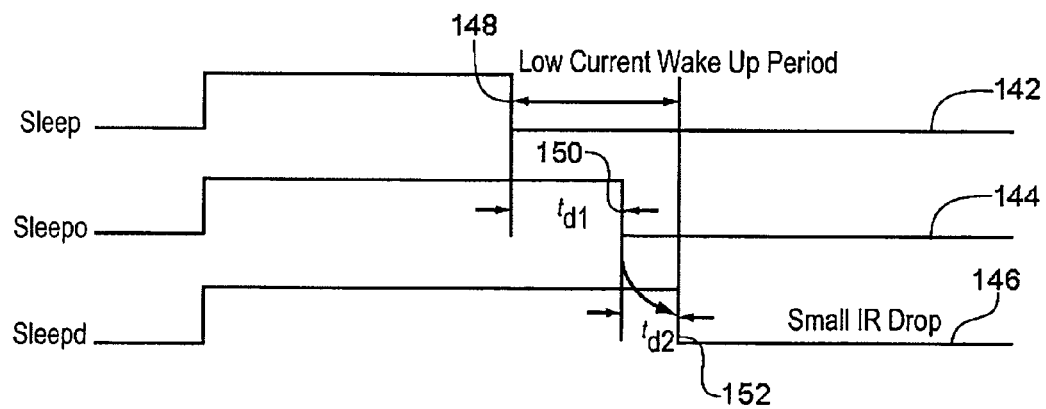
FIG. 5 is a timing diagram of the multi-stage power-up sequence provided by the low leakage power management system of FIG. 4.

FIG. 5 is a timing diagram of the power-up sequence of the power management system 120 of FIG. 4. The timing diagram shows the logic states of the SLEEP signal 142, the SLEEPO signal 144 and the SLEEPD signal 146. The state machine 128 de-asserts the SLEEP signal 142 at the high to low transition 148. This initiates the low current "wake up" stage in which the switch cells only partially couple the external supply voltage $V_{DD}$ to the internal voltage supply bus $V_{DDV}$ of the logic core. The transition 148 in the SLEEP signal 142 is reflected in the high to low transition 150 in the SLEEPO signal 144. The delay $t_{d1}$ between the transition in the SLEEP signal 142 and the transition in the SLEEPO signal 144 is associated with the propagation delay required for de-asserted SLEEP signal 142 to propagate to all of the switch cells. After the propagation delay the SLEEPO signal 144 transitions from logic high to logic low and is returned to the state machine. At this point in the power-up sequence, power is being delivered to the logic core through all of the switch cells, albeit at a reduced voltage or in current limited manner. A short time later, after a delay $t_{d2}$, the SLEEPD signal 146 is de-asserted at 152. The SLEEPD signal 146 propagates to all of the switch cells, causing the switch cells to fully couple the external supply voltage to the logic core without substantial restriction to the amounts current allowed to flow through the switch cells to the logic core. Because a reduced supply voltage or limited current has already been supplied to the logic core during the first stage of the wake-up procedure, fully coupling the external supply voltage to the logic core results in a much smaller current spike than would have been the case had all of the switch cells been fully closed in a single step and unlimited current allowed to flow immediately into the logic core. Furthermore, limiting the current flow into the logic core during the first stage prevents a large current spike through the first switch cell when the first switch cell's power switch is the only switch closed. This prevents damage to the switch cell's power pads due to excess current flow. With the two-stage approach, current flows into the logic core more evenly, and the conductors connecting the supply voltage to the integrated circuit chip may be uniformly sized.

Figure 6:
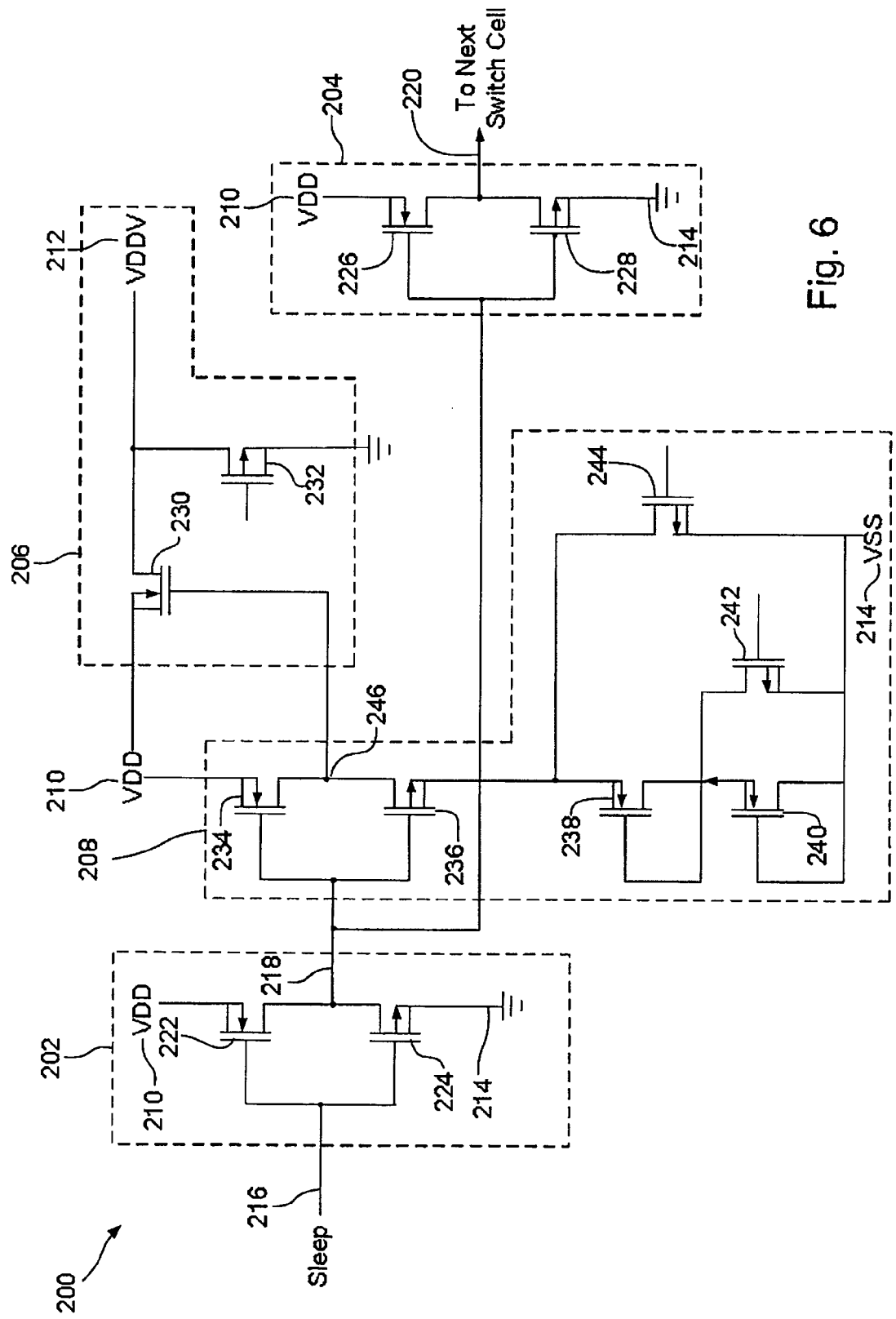
FIG. 6 is a detailed schematic drawing of a switch cell circuit according to an embodiment of the invention.

FIG. 6 is a schematic diagram of a switch cell 200 according to an embodiment of the invention. The switch cell 200 provides a multi-stage power-up sequence for connecting an external supply voltage $V_{DD}$ 210 to the logic core of an integrated circuit chip. The switch cell 200 is similar to the switch cell 50 of FIG. 3 in that the switch cell 200 also includes a SLEEP signal buffer comprising a first inverter 202, a second inverter 204, and a power circuit 206 for connecting the external supply voltage $V_{DD}$ 210 to the internal supply voltage plane $V_{DDV}$ 212 of the logic core. Unlike the previous circuit, however, the switch cell 200 further includes a modified inverter circuit 208 for driving the gate voltage of a PMOS power switch 230 in the power circuit 206 for coupling the external supply voltage $V_{DD}$ 210 to the internal supply voltage plane $V_{DDV}$ 212.

An externally generated SLEEP signal 216 is input to the first inverter 202. The SLEEP signal is high during periods when power is to be withdrawn from the integrated circuit chip, and low when power is to be restored. The first inverter 202 comprises a PMOS switch 222 and an NMOS switch 224 connected in series between the external supply voltage $V_{DD}$ 210 and the logic common $V_{SS}$ 214. The gates of the PMOS switch 222 and the NMOS switch 224 are driven by the SLEEP signal 216. The output 218 of the first inverter 202 is taken from the circuit node formed by the series connection between the PMOS switch 222 and the NMOS switch 224. The second inverter 204 also comprises a PMOS switch 226 and an NMOS switch 228 connected in series between the external supply voltage $V_{DD}$ 210 and logic common $V_{SS}$ 214. The output 218 of the first inverter 202 drives the gates of the PMOS switch 226 and the NMOS switch 228. The output 220 of the second inverter 204 is taken from the series node connecting the PMOS switch 226 and the NMOS switch 228.

When the input SLEEP signal 216 is high, the PMOS switch 222 of the first inverter 202 is open (non-conducting) and the NMOS switch 224 is closed (conducting). In this state, the output 218 of the first inverter 202 is essentially connected to logic common $V_{SS}$ 214. In other words, when the SLEEP signal 216 input to the first inverter 202 is logic high, the output 218 of the first inverter 202 is logic low. When the SLEEP signal 216 input to the first inverter 202 is low, the PMOS switch 222 is closed (conducting) and the NMOS switch 224 is opened (non-conducting). In this state, the output 218 of the first inverter 202 is essentially connected to the external supply voltage $V_{DD}$ 210. In other words, when the SLEEP signal 216 input to the first inverter 202 is logic low, the output 218 of the first inverter 202 will be essentially $V_{DD}$, or logic high. Thus, the first inverter 202 inverts the state of the input SLEEP signal 216. The second inverter 204 operates in exactly the same way, inverting the state of the first inverter output 218. Inverting the output 218 of the first inverter 202 restores the original SLEEP signal 216. The output 220 of the second inverter 204 is then provided as an input to the next switch cell or is returned to the power management module depending on the switch cell's position within the sequence of linked switch cells.

The power circuit 206 is similar to the power circuit 54 of FIG. 3. A PMOS power switch 230 is disposed between the external supply voltage $V_{DD}$ 210 and the internal supply voltage plane $V_{DDV}$ 212 of the integrated circuit's logic core. The PMOS power switch 230 controls whether power is provided to the logic core through the switch cell 200. An NMOS pull down switch 232 may be provided to couple the internal supply voltage plane $V_{DDV}$ 212 to logic common $V_{SS}$ 214 when the external supply voltage $V_{DD}$ 210 is disconnected. The only difference between the power circuit 206 of FIG. 6 and the power circuit 54 of FIG. 3 is that the gate of the PMOS power switch 230 is driven by a separate modified inverter circuit 208 rather than the output of the second inverter 204 as in the power circuit 54 of FIG. 3.

Like the first and second inverters 202, 204 of the SLEEP signal buffer circuit, the modified inverter circuit 208 includes a PMOS switch 234 and an NMOS switch 236 connected in series. However, the modified inverter circuit 208 further includes first and second PMOS diodes 238 and 240 in series between the NMOS switch 236 and logic common $V_{SS}$ 214. The bodies of the two PMOS devices 238, 240 are connected to $V_{DD}$ 210. A first NMOS bypass switch 242 is connected in parallel with second PMOS diode 240, and a second NMOS bypass switch 244 is connected in parallel with both the first and second PMOS diodes 238, 240. The output 246 of the modified inverter circuit 208 is taken from the series node between the PMOS switch 234 and the NMOS switch 236. The modified inverter output 246 drives the gate of the PMOS power switch 230 in the power circuit 206.

The PMOS power switch 230 is open (non-conducting) when the gate voltage is high and closed (conducting) when the gate voltage is low. If the gate voltage applied to the PMOS power switch 230 is at some intermediate value between logic high and logic low, the power switch 230 will be partially closed, allowing a limited current to flow from the external power supply to the logic core of the integrated circuit chip. By incrementally closing the PMOS power switch 230, the external supply voltage $V_{DD}$ 210 may be reconnected to the internal supply voltage plane $V_{DDV}$ 212 in a controlled manner. In this way, a large current spike rushing into the logic core when the first several switch cells are sequentially closed may be avoided, and damage to the switch cells and their associated power pads may be prevented.

The modified inverter circuit 208 is adapted to close the PMOS power switch 230 in steps when exiting the SLEEP mode. When the SLEEP signal 216 input to the first inverter 202 is high, the integrated circuit powered by the switch cell is intended to be in SLEEP mode. Under these conditions, the output 218 of the first inverter circuit 202 is essentially $V_{SS}$ 214, or logic low. The output 218 of the first inverter 202 is the input to the modified inverter circuit 208. When the output 218 of the first inverter circuit 202 is low, the PMOS switch 234 of the modified inverter circuit 208 is closed (conducting) and the NMOS switch 236 is open. Thus, when the input SLEEP signal 216 is high, the gate voltage applied to the PMOS power switch 230 is essentially $V_{DD}$ 210, or logic high. With the gate voltage high, the PMOS power switch 230 is open (non-conducting). With the power switch 230 open, the external supply voltage $V_{DD}$ 210 is disconnected from the internal supply voltage plane $V_{DDV}$ 212 of the integrated circuit chip.

When the input SLEEP signal 216 is switched to logic low, indicating that the SLEEP mode is over and that power is to be restored to the integrated circuit chip, the output 218 of the first inverter 202 switches from low to high. Thus, the gate voltage applied to the PMOS switch 234 and the NMOS switch 236 of the modified inverter is $V_{DD}$ 210 or logic high. This causes the PMOS switch 234 to switch open (non-conducting) and the NMOS switch 236 to switch closed (conducting). Initially, the bypass switches 242 and 244 are both open so that the PMOS diodes 238 and 240 are both connected in series with the NMOS switch 236. When the PMOS switch 234 opens and the NMOS switch 236 closes, the gate of the PMOS power switch 230 is coupled to logic common $V_{SS}$ 214 through the closed (conducting) NMOS switch 236 and the series connected PMOS diodes 238, 240. Each PMOS diode 238, 240 has a threshold voltage drop $V_{TH}$ associated with the junction and the sub-threshold leakage current of PMOS switch 234 which flows through the diodes.

Accordingly, when both PMOS diodes 238 and 240 are connected in series with the NMOS switch 236 and the NMOS switch 236 is closed, the gate voltage applied to the PMOS power switch 230 is $2V_{TH}$ above logic common $V_{SS}$ 214. Thus, the source-gate voltage drop across the PMOS power switch 230 is diminished by $2V_{TH}$ and the PMOS switch 230 does not become fully conductive. Under these conditions, a limited current flows through the PMOS power switch 230 to the integrated circuit chip's logic core. The bypass switches 242 and 244 may be closed individually to selectively remove the PMOS diodes 238, 240 from the modified inverter circuit 208. Closing the bypass switch 242 essentially forms a short circuit around the PMOS diode 240, effectively removing the PMOS diode 240 from the series path from the PMOS power switch 230 circuit to logic common $V_{SS}$ 214. This reduces the gate voltage applied to the PMOS power switch 230 to just $V_{TH}$ above logic common $V_{SS}$ 214. This increases the source-gate voltage drop across the PMOS power switch 230, causing the PMOS power switch 230 to become more conductive and thus reducing the current limiting effect of the loosely closed switch and allowing more current to flow into the logic core.

Closing the second NMOS bypass switch 244 forms an effective short circuit around both PMOS diodes 238, 240. Short circuiting both PMOS diodes 238 and 240 completely eliminates the threshold voltage drops associated with the PMOS diodes 238, 240 from the PMOS power switch 230 gate circuit. Under these conditions, the PMOS power switch 230 gate voltage is now coupled directly to logic common $V_{SS}$ 214. The source-gate voltage across the PMOS power switch 230 is now at a maximum and the switch 230 is completely closed. Current is allowed to flow into the logic core substantially without restriction. The multi-stage process for exiting SLEEP mode embodied in the switch cell 200 allows power to be restored to the integrated circuit chip in a controlled and uniform manner without large current spikes.

The bypass switches 242, 244 may be controlled by registers in a state machine associated with the power management module. For example, a state machine such as state machine 128 in FIG. 4, may initiate a signal to close the first bypass switch 242, after the SLEEP signal has propagated to all switch cells and the SLEEPO signal has returned to the state machine. Similarly, the state machine may initiate a signal to close the second bypass switch 244 once the signal to close the first bypass switch 242 has propagated to all of the switch cells and returned to the state machine. The switch cell 200 has the additional flexibility that more or fewer PMOS diodes may be added to the modified inverter circuit 208 with a corresponding number of bypass switches in order to increase or decrease the desired number of stages in the multi-stage power-up sequence.

Figure 7:
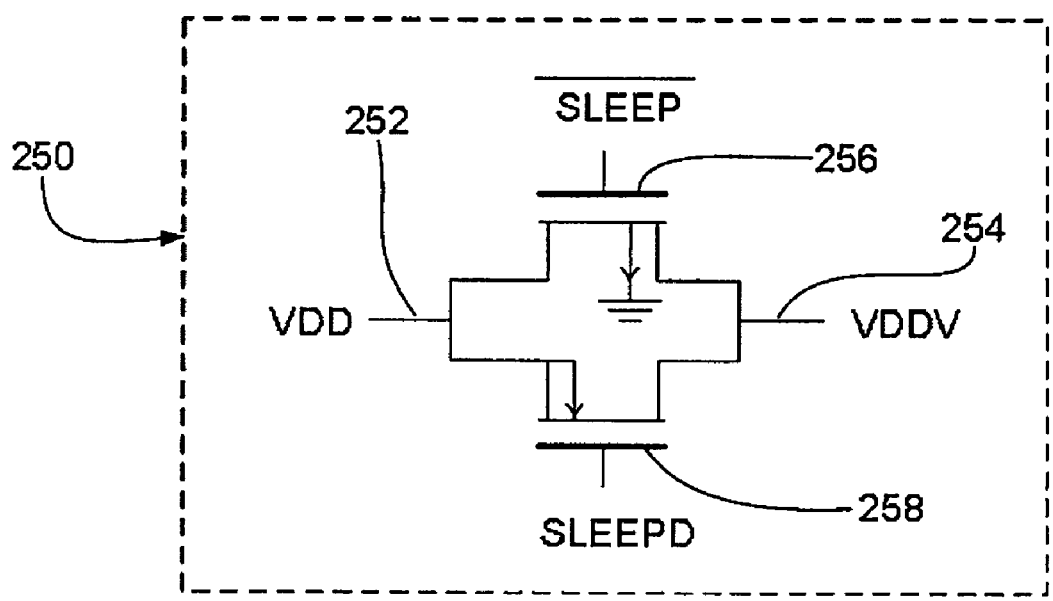
FIG. 7 is a schematic drawing of a power switch according to an embodiment of the invention.

FIG. 7 shows an alternative embodiment of a switch cell power circuit 250. The circuit 250 provides a two-step power-up sequence for re-connecting power to an integrated circuit chip after power has been cut-off during SLEEP mode. The switch cell circuit 250 comprises an NMOS switch 256 in parallel with the primary PMOS power switch 258. The external supply voltage $V_{DD}$ is coupled to the drain of the NMOS switch 256 as well as the source of the PMOS switch 258. The source of the NMOS switch 256 and the drain of the PMOS switch 258 are coupled to the output of the power circuit 250 and provided to the internal supply voltage plane $V_{DDV}$ 254 of the integrated circuit chip. The two-step power up sequence is the same as that shown in FIGS. 4 and 5. In a first stage of the power-up sequence, a state machine de-asserts the SLEEP signal from high to low. Conversely, the $\overline{SLEEP}$ signal transitions from low to high. The $\overline{SLEEP}$ signal turns on the NMOS switch 256 and provides voltage to the internal voltage supply $V_{DDV}$ 254. The NMOS switch is sized such that it can only conduct a limited amount of current. The nature of the NMOS device is such that the current through the NMOS switch 256 decreases as $V_{DDV}$ increases, thereby further limiting the current. The SLEEPD signal applied to the gate of the PMOS switch 258 is held at logic high so that the PMOS switch 258 remains open (non-conducting). Thus, when the NMOS switch 256 is conductive while the PMOS switch 258 remains open, power flows into the logic core of the integrated circuit, but a large current spike is avoided. Once the NMOS switches in all of the switch cells feeding the logic core have been turned on and the SLEEPO signal changes from high to low, the SLEEPD signal may be turned off causing the PMOS switch 258 to close. The PMOS switch 258 allows a substantially unrestricted current to flow into the logic core. Closing the PMOS switch 258 allows full power to flow to the integrated circuit chip, completing the power-up sequence. Again, the two-step approach ensures that power flows into the logic core in a more controlled and uniform manner, without significant transients.

Figure 8:
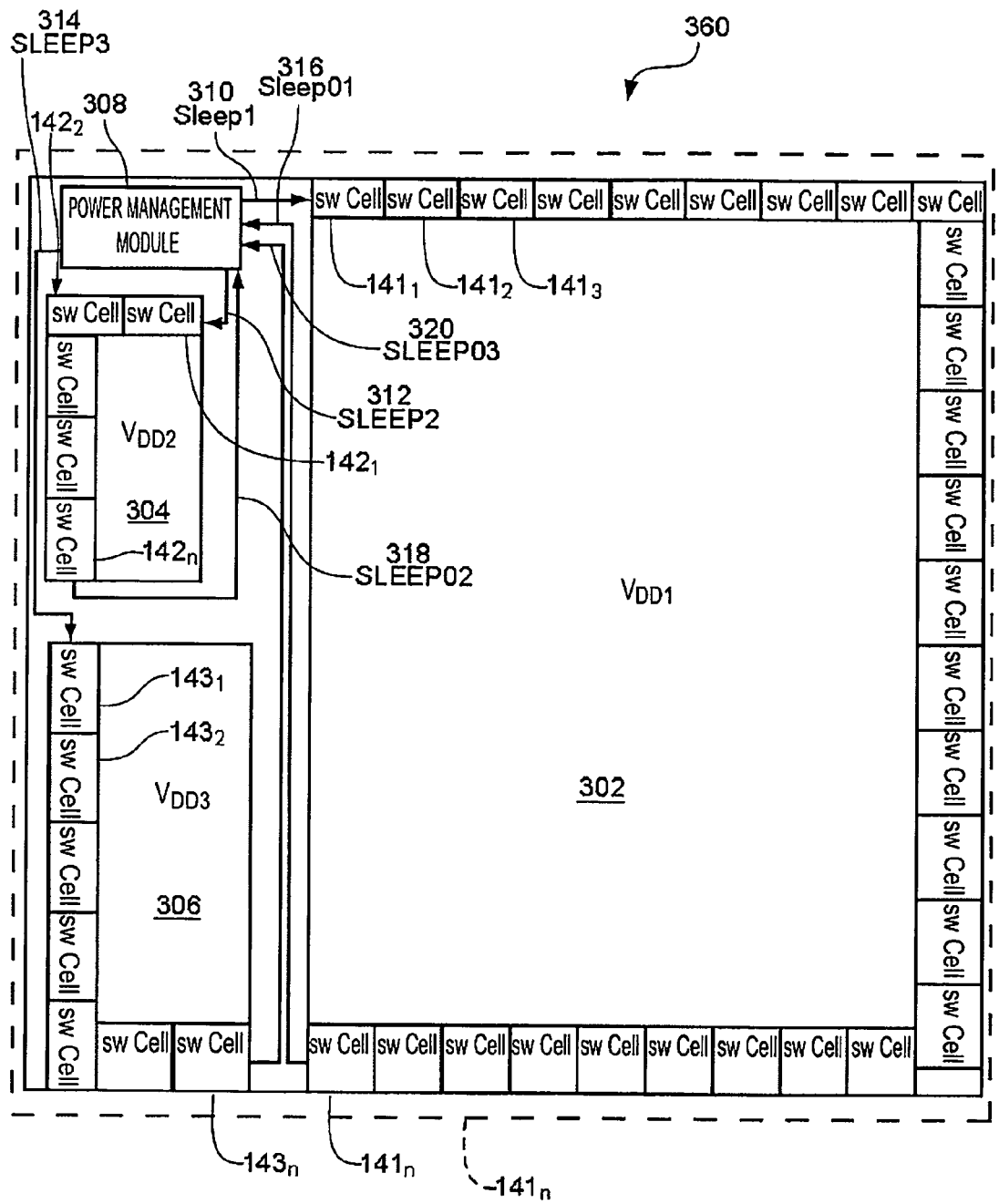
FIG. 8 is a floor plan of an embodiment of an integrated circuit chip incorporating a low leakage power management system.

The low leakage power management methods described above may be applied to integrated circuit chips having multiple VDD supplies as shown in FIG. 8. An integrated circuit chip 300 comprises 3 logic cores powered by 3 different VDD supplies, VDD1 302, VDD2 304 and VDD3 306. The 3 logic cores 302, 304 and 306 can enter and exit sleep mode simultaneously, sequentially, or independently using the controls from the power management module 308. For example, if the logic cores 302, 304 and 306 are to be powered down and up at the same time, the power management module 308 may assert and de-assert SLEEP1 310, SLEEP2 312 and SLEEP3 314 simultaneously and monitor the propagated SLEEPO1 316, SLEEPO2 318 and SLEEPO3 320 signals to initiate multi-phase power-up sequences as described above. In many applications, some logic cores may be running at high speed and may only need to be powered on when certain applications are running. In this case, various logic cores can be put into sleep mode separately and dynamically. For example, assuming logic core 302 consumes a large amount of power, and it is preferred that it be placed in the sleep mode when it is not needed. It can be powered down by only asserting the SLEEP1 signal. The multi-phase power-up sequence described may then be used to reconnect the voltage supply to the VDD1 power plane when SLEEP1 is de-asserted. Eliminating the current spike with the multi-phase power-up sequence when the supply of logic core 302 is reconnected can greatly improve the stability of the chip 300 as well as the whole system.

Figure 9A:
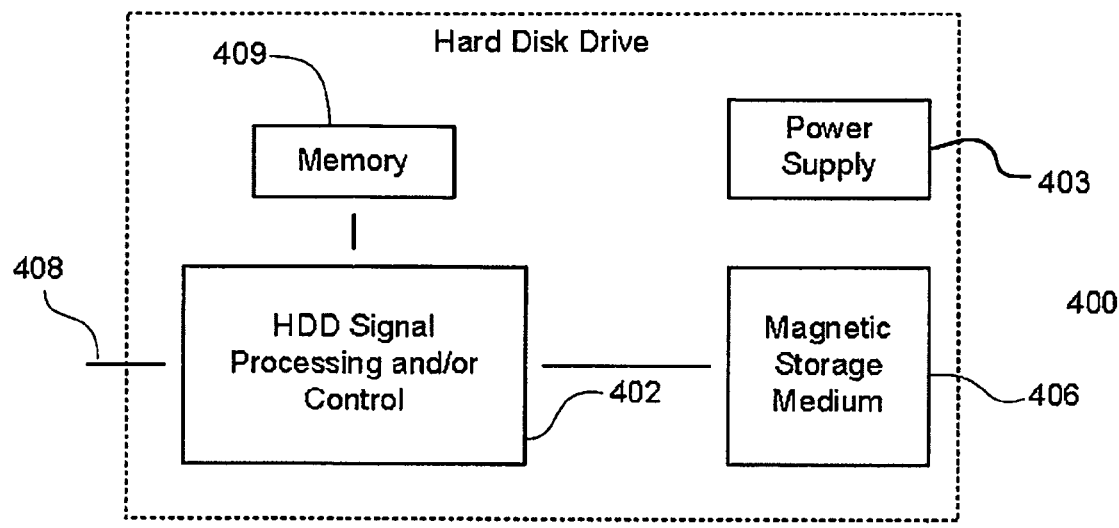
FIG. 9A is a functional block diagram of a hard disk drive.

Examples of electronic devices where the low leakage power management system described above may be utilized are illustrated in FIGS. 9A-9G. As shown in FIG. 9A, the present invention can be implemented in a hard disk drive (HDD) 400. The present invention may be implemented in either or both of the signal processing and/or control circuits, which are generally identified in FIG. 9A at 402. Another implementation of the low leakage power management system in the HDD is in the magnetic sensor or read/write head associated with the magnetic storage medium 406. In some implementations, the signal processing and/or control circuit 402 and/or other circuits within which the above described low leakage power management system is integrated (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Figure 9B:
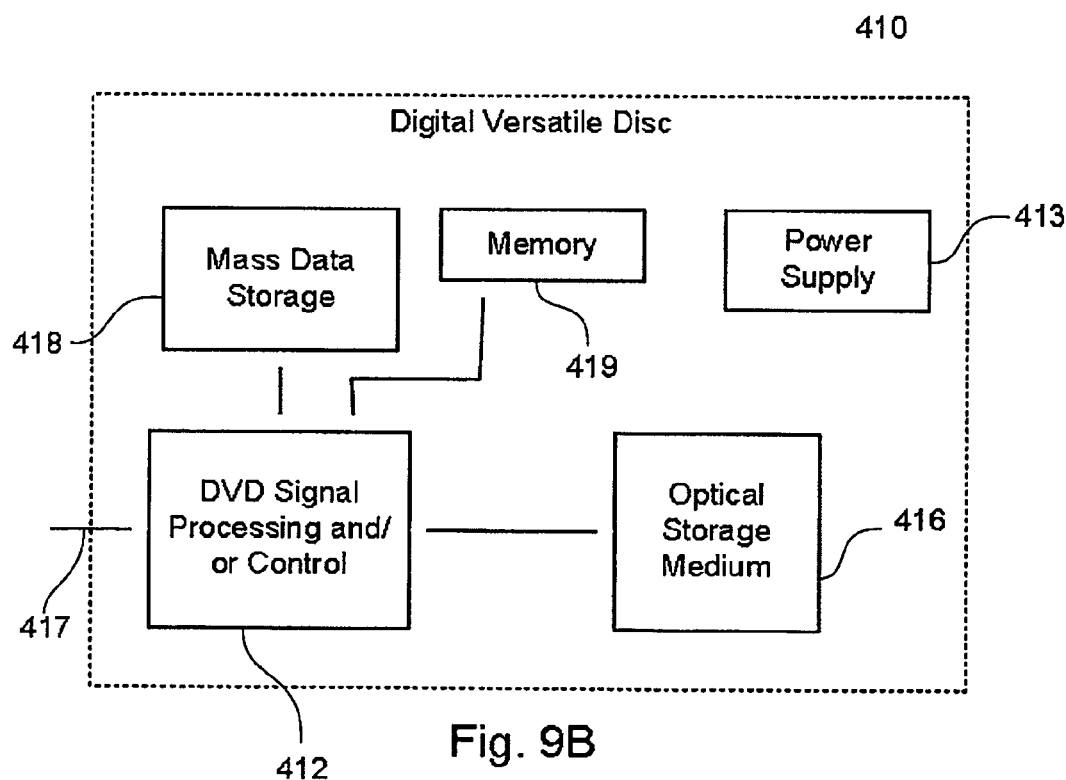
FIG. 9B is a functional block diagram of a digital versatile disk (DVD)

Referring now to FIG. 9B, the present invention can be implemented in a digital versatile disc (DVD) drive 410. The present invention may implement and/or be implemented in either or both signal processing and/or control circuits, which are generally identified in FIG. 9B at 412, and/or mass data storage 418 of the DVD drive 410. The signal processing and/or control circuit 412 and/or other circuits (not shown) in the DVD drive 410 may process data, perform coding and/or encryption, perform calculations, and/or format data that is read from and/or data written to an optical storage medium 416. The low leakage power management system disclosed herein may be integrated into one or more components of the DVD drive 410 which handle various tasks such as buffering digital clock signals. In some implementations, the signal processing and/or control circuit 412 and/or other circuits (not shown) in the DVD drive 410 can also perform other functions such as encoding and/or decoding and/or any other signal processing functions associated with a DVD drive 410.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 9A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 9C:
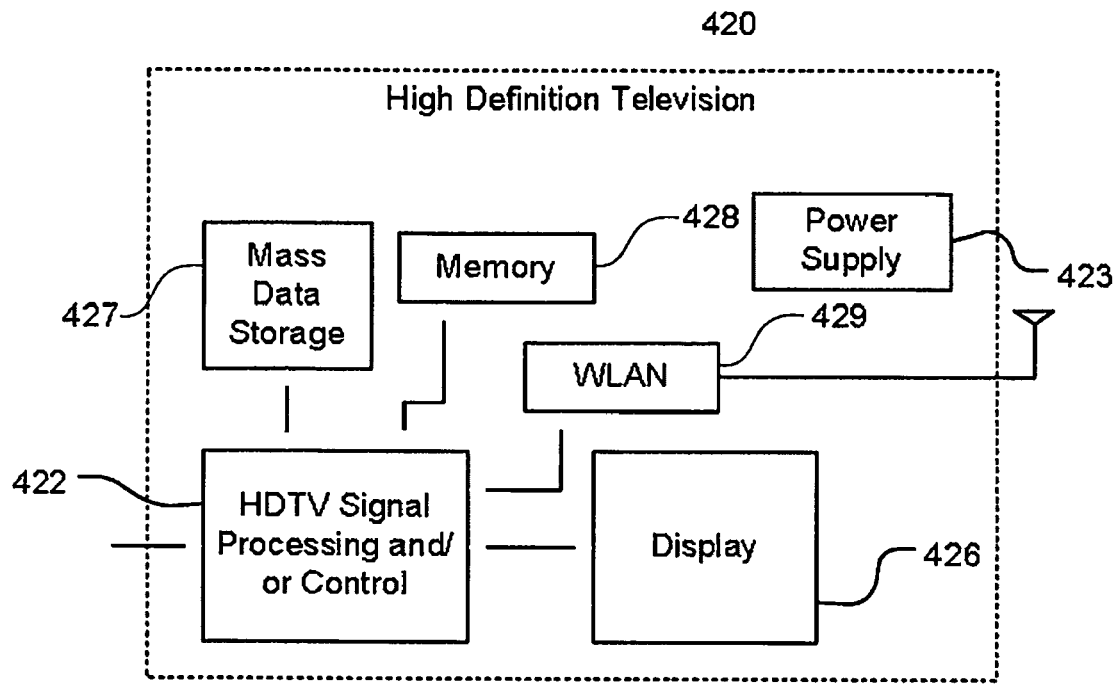
FIG. 9C is a functional block diagram of a high definition television.

Referring now to FIG. 9C, the present invention can be implemented in a high definition television (HDTV) 420. The present invention may implement and/or be implemented in either or both signal processing and/or control circuits, which are generally identified in FIG. 9C at 422. The HDTV 420 receives HDTV input signals in either a wired or wireless format and generates HDTV output signals for a display 426. The low leakage power management system described above may be part of buffered multiplexers integrated into the HDTV 420 for video applications, such as those needed when multiplexing signals from two video sources. In some other implementations, signal processing circuit and/or control circuit 422 and/or other circuits implementing the low leakage power management system of the type described above (not shown) may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 9A and/or at least one DVD may have the configuration shown in FIG. 9B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Figure 9D:
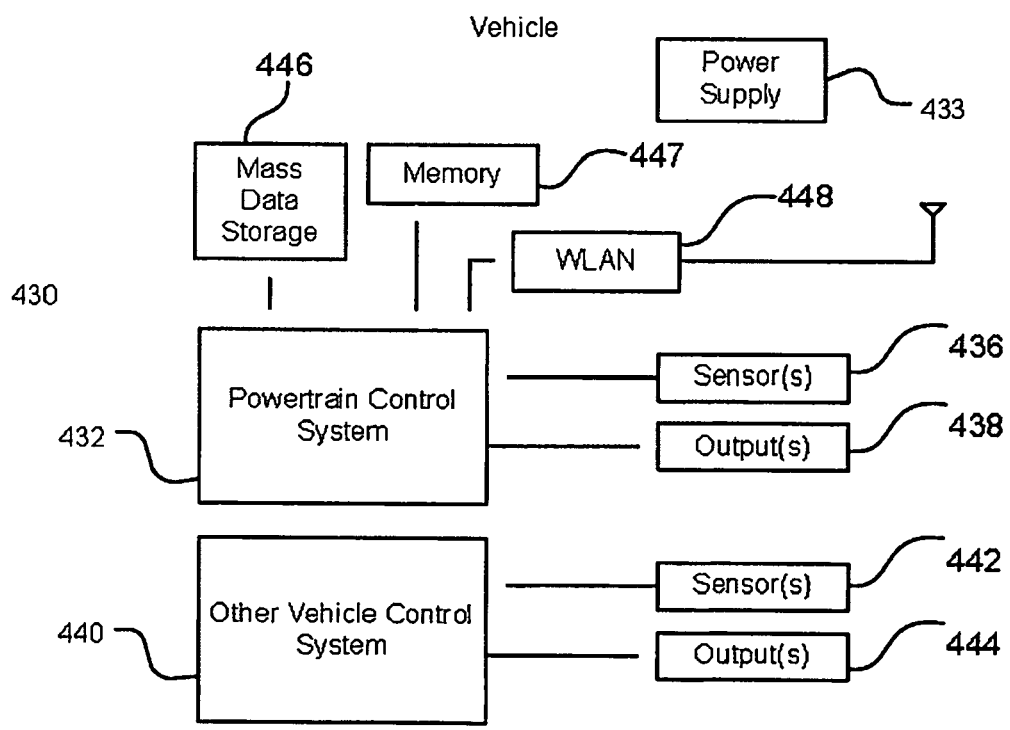
FIG. 9D is a functional block diagram of a vehicle control system.

Referring now to FIG. 9D, the present invention may be implemented in a control system of a vehicle 430, a WLAN interface 448, mass data storage 446 of the vehicle control system and/or a power supply 433. In some implementations, the low leakage power management system described herein may be implemented in a powertrain control system 432 which buffers signals in or from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Each of these systems, or communication links between the systems, may integrate the low leakage power management system described above. Still other implementations are contemplated as well.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 9E:
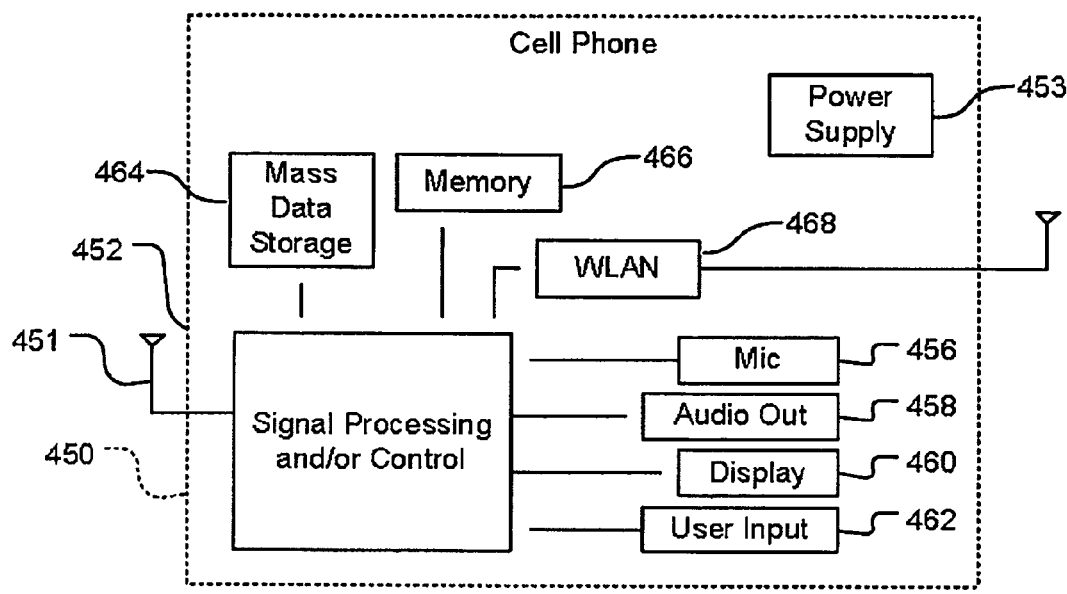
FIG. 9E is a functional block diagram of a cellular phone.

Referring now to FIG. 9E, the present invention can be implemented in a cellular phone 450 that may include a cellular antenna 451. Because of the lower power consumption aspect of the low leakage power management system discussed herein, it is particularly well-suited to battery powered devices such as cell phones. The disclosed low leakage power management system may be implemented in either or both signal processing and/or control circuits, which are generally identified in FIG. 9E at 452, a WLAN interface 468, and/or mass data storage 464 of the cellular phone 450. In some implementations, the cellular phone 450 includes a microphone 456, an audio output 458 such as a speaker and/or audio output jack, a display 460 and/or an input device 462 such as a keypad, pointing device, voice actuation and/or other input device incorporating the driver circuitry. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 9F:
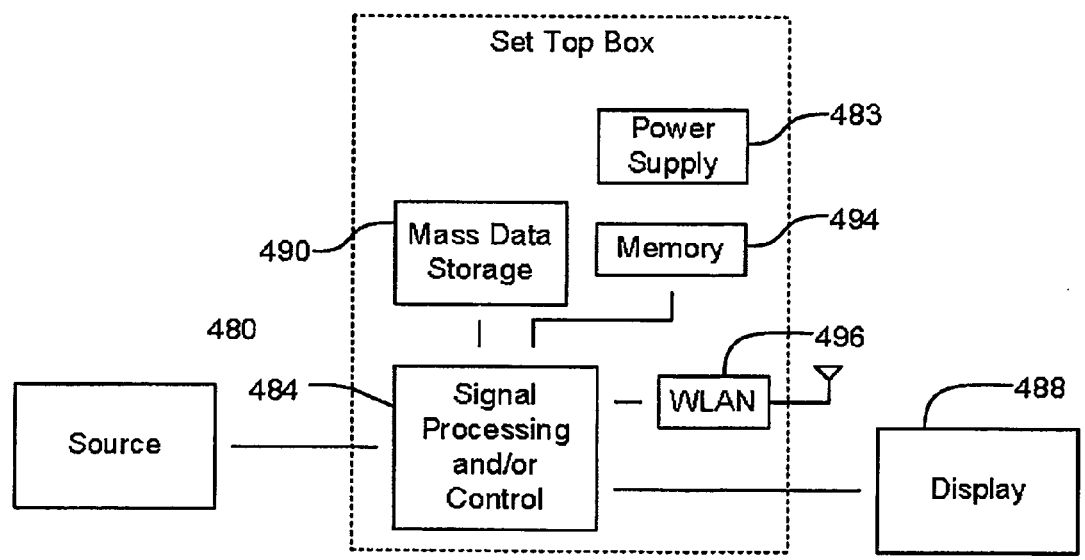
FIG. 9F is a functional block diagram of a set top box.

Referring now to FIG. 9F, the present invention can be implemented in a set top box 480. The low leakage power management system discussed above may be implemented in either or both of the signal processing and/or control circuits, which are generally identified in FIG. 9F at 484, a WLAN interface 496, and/or a mass data storage 490 of the set top box 480. The set top box 480 receives signals from a source such as a broadband source and may output standard and/or high definition audio/video signals, via differential driver circuits integrated in the set top box 480, suitable for a display 488 such as a television and/or monitor and/or other video and/or audio output devices. The signal processing and/or control circuits 484 and/or other circuits (not shown) of the set top box 480 utilizing the low leakage power management system may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 9G:
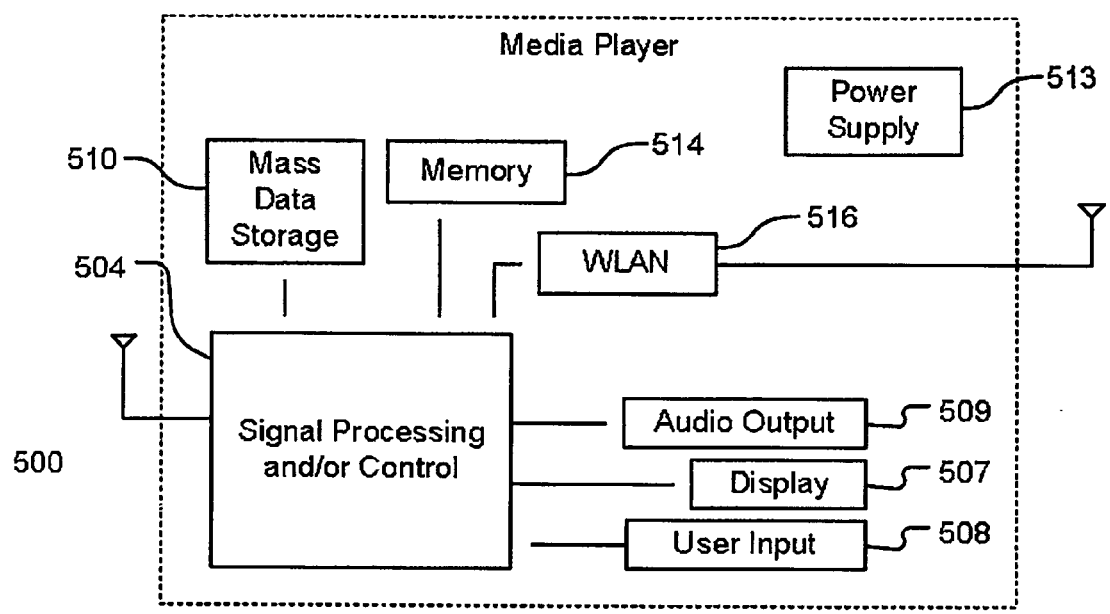
FIG. 9G is a functional block diagram of a media player.

Referring now to FIG. 9G, the disclosed low leakage power management system may also be implemented in a media player 500. The low leakage power management system may be implemented in either or both of the signal processing and/or control circuits, which are generally identified in FIG. 9G at 504, a WLAN interface, and/or a mass data storage of the media player 500. In some implementations, the media player 500 includes a display 507 and/or a user input 508 such as a keypad, touchpad and the like integrating the low leakage power management systems as discussed above. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

It is intended that the foregoing detailed description be understood as an illustration of selected forms that the invention can take and not as a definition of the invention. It is only the following claims, including all equivalents, that are intended to define the scope of this invention.

The invention claimed is:

1. A method of controlling a multi-phase power up sequence for providing power to an integrated circuit chip comprising:
   propagating a first signal along a plurality of switch cells, by propagating from a first switch cell to a second switch cell;
   allowing a first current to flow into the integrated circuit chip in response to the first signal propagating along the plurality of switch cells;
   propagating a second signal along the plurality of switch cells, by propagating from the first switch cell to the second switch cell, after the first signal has propagated through the plurality of switch cells; and
   allowing a second current to flow into the integrated circuit chip in response to the second signal propagating along the plurality of switch cells.

2. The method of claim 1 wherein the second current is greater than the first current.

3. The method of claim 1 wherein allowing the first current to flow into the integrated circuit chip comprises coupling an external supply voltage to the integrated circuit chip at a first voltage level, and allowing the second current to flow into the integrated circuit chip comprises coupling the external supply voltage to the integrated circuit chip at a second voltage level.

4. A power management system comprising:
   a switch cell circuit for selectively coupling an external supply voltage to an integrated circuit, the switch cell circuit comprising:
      a sleep signal buffer adapted to receive a sleep signal and output the sleep signal after a delay; and
   a power circuit for connecting the external supply voltage to the integrated circuit, the power circuit including a power switch and a pull down switch, the power switch responsive to the sleep signal such that the power switch is non-conducting when the sleep signal is asserted and conducting when the sleep signal is de-asserted, the pull down switch responsive to a pull down signal such that the pull down switch is conducting when the pull down signal is asserted and non-conducting when the pull down signal is de-asserted, wherein the switch cell circuit is one of a plurality of switch cell circuits connected in series and the sleep signal propagates through the plurality of switch cells circuits; and a power management module for monitoring the sleep signal.

5. The power management system of claim 4 wherein the power switch comprises a PMOS power switch driven by the output of the sleep signal buffer.

6. The power management system of claim 4 wherein the sleep signal buffer comprises first and second inverters connected in series such that the first inverter inverts a state of the sleep signal and the second inverter restores the sleep signal to an original state as the sleep signal.

7. The power management system of claim 4, wherein the power management module monitors the sleep signal by receiving the sleep signal from a last switch cell circuit in the series.

8. The power management system of claim 4, wherein the power management module monitors the sleep signal at each of the plurality of switch cell circuits as it propagates through the plurality of switch cells circuits.

9. The power management system of claim 4 wherein the power switch comprises an NMOS transistor connected in parallel with a PMOS transistor, a transistor gate of the NMOS transistor is driven by a first control signal, and a transistor gate of the PMOS transistor is driven by a second control signal in a manner such that when power is restored to the integrated circuit chip the first control signal causes the NMOS transistor to become conductive, and after a delay the second control signal causes the PMOS transistor to become conductive, the NMOS transistor providing a first level of power to the integrated circuit chip, and the PMOS transistor providing a second level of power to the integrated circuit chip.

10. A switch cell circuit for selectively coupling an external supply voltage to an integrated circuit, the switch cell circuit comprising:

a sleep signal buffer adapted to receive a sleep signal and output a corresponding sleep signal after a delay; and a power circuit for connecting the external supply voltage to the integrated circuit, the power circuit including a power switch and a pull down switch, the power switch responsive to the received sleep signal such that the power switch is non-conducting when the received sleep signal is asserted and conducting when the received sleep signal is de-asserted, the pull down switch responsive to a pull down signal such that the pull down switch is conducting when the pull down signal is asserted and non-conducting when the pull down signal is de-asserted, wherein the sleep signal buffer comprises first and second inverters connected in series such that the first inverter inverts a state of the received sleep signal and the second inverter restores the inverted sleep signal to a same state as the received sleep signal, wherein the power switch comprises a PMOS power switch, and the switch cell circuit further includes a modified inverter circuit for driving the PMOS power switch with multiple gate voltages to provide a multi-stage power-up sequence for the integrated circuit, and wherein the power switch comprises a PMOS power switch, and the switch cell circuit further includes a modified inverter circuit for driving the PMOS power switch with multiple gate voltages to provide a multi-stage power-up sequence for the integrated circuit.

11. A switch cell circuit for selectively coupling an external supply voltage to an integrated circuit, the switch cell circuit comprising:

a sleep signal buffer adapted to receive a sleep signal and output a corresponding sleep signal after a delay; and a power circuit for connecting the external supply voltage to the integrated circuit, the power circuit including a power switch and a pull down switch, the power switch responsive to the received sleep signal such that the power switch is non-conducting when the received sleep signal is asserted and conducting when the received sleep signal is de-asserted, the pull down switch responsive to a pull down signal such that the pull down switch is conducting when the pull down signal is asserted and non-conducting when the pull down signal is de-asserted, wherein the sleep signal buffer comprises first and second inverters connected in series such that the first inverter inverts a state of the received sleep signal and the second inverter restores the inverted sleep signal to a same state as the received sleep signal, wherein the power switch comprises a PMOS power switch, and the switch cell circuit further includes a modified inverter circuit for driving the PMOS power switch with multiple gate voltages to provide a multi-stage power-up sequence for the integrated circuit, and wherein the modified inverter circuit comprises a PMOS inverter switch, an NMOS inverter switch, a PMOS diode connected in series between a logic high voltage plane and a logic common voltage plane, and a bypass switch in parallel with the diode, the inverted sleep signal output from the first inverter is input to the modified inverter circuit to drive the PMOS and NMOS inverter switches, a circuit node formed between the series PMOS and NMOS inverter switches provides the output of the modified inverter circuit for driving the PMOS power switch.

12. A power management system comprising:

switch cell circuit for selectively coupling an external supply voltage to an integrated circuit, the switch cell circuit comprising:

sleep signal buffer means for receiving a sleep signal and outputting the sleep signal after a delay; and power circuit means for connecting the external supply voltage to the integrated circuit, the power circuit including means responsive to the sleep signal for switching the external supply voltage such that the external supply voltage is decoupled from the integrated circuit when the sleep signal is asserted and is coupled to the integrated circuit when the sleep signal is de-asserted, and means responsive to a pull down signal for switching an internal supply voltage plane on the integrated circuit to a logic common voltage plane, such that the internal supply voltage plane is coupled to the logic common voltage plane when the pull down signal is asserted and decoupled from the logic common voltage plane when the pull down signal is de-asserted;

wherein the switch cell circuit is one of a plurality of switch cell circuits connected in series and the sleep signal propagates through the plurality of switch cells circuits; and power management means for monitoring the sleep signal.

13. The power management system of claim 12 wherein the means responsive to the sleep signal comprises a PMOS power switch driven by the output of the sleep signal buffer means.

14. The power management system of claim 12 wherein the sleep signal buffer means comprises first inverter means and second inverter means for inverting a logic state of a receive signal, the first and second inverter means connected in series such that the first inverter means inverts the sleep signal and the second inverter means restores the sleep signal to an original logic state of the sleep signal.

15. The power management system of claim 12 wherein the means responsive to the received sleep signal for switching the external supply voltage comprises an NMOS transistor in parallel with a PMOS transistor, the gate of the NMOS transistor is driven by a first control signal, and a gate of the PMOS transistor is driven by a second control signal in a manner such that when power is restored to the integrated circuit chip the first control signal causes the NMOS transistor to become conductive, and after a delay the second control signal causes the PMOS transistor to become conductive, the NMOS transistor providing a first level of power to the integrated circuit chip, and the PMOS transistor providing a second level of power to the integrated circuit chip.

16. A switch cell circuit for selectively coupling an external supply voltage to an integrated circuit, the switch cell circuit comprising:

sleep signal buffer means for receiving a sleep signal and outputting a corresponding sleep signal after a delay; and power circuit means for connecting the external supply voltage to the integrated circuit, the power circuit including means responsive to the received sleep signal for switching the external supply voltage such that the external supply voltage is decoupled from the integrated circuit when the received sleep signal is asserted and is coupled to the integrated circuit when the received sleep signal is de-asserted, and means responsive to a pull down signal for switching an internal supply voltage plane on the integrated circuit to a logic common voltage plane, such that the internal supply voltage plane is coupled to the logic common voltage plane when the pull down signal is asserted and decoupled from the logic common voltage plane when the pull down signal is de-asserted, wherein the means responsive to the received sleep signal for switching the external supply voltage comprises a PMOS power switch, the switch cell circuit further including means for driving the PMOS power switch with multiple gate voltages to provide a multi-stage power-up sequence for the integrated circuit.

17. A switch cell circuit for selectively coupling an external supply voltage to an integrated circuit, the switch cell circuit comprising:

sleep signal buffer means for receiving a sleep signal and outputting a corresponding sleep signal after a delay; and power circuit means for connecting the external supply voltage to the integrated circuit, the power circuit including means responsive to the received sleep signal for switching the external supply voltage such that the external supply voltage is decoupled from the integrated circuit when the received sleep signal is asserted and is coupled to the integrated circuit when the received sleep signal is de-asserted, and means responsive to a pull down signal for switching an internal supply voltage plane on the integrated circuit to a logic common voltage plane, such that the internal supply voltage plane is coupled to the logic common voltage plane when the pull down signal is asserted and decoupled from the logic common voltage plane when the pull down signal is de-asserted, wherein the means responsive to the received sleep signal comprises a PMOS power switch driven by the output of the sleep signal buffer means, wherein the sleep signal buffer means comprises first inverter means and second inverter means for inverting a logic state of a receive signal, the first and second inverter means connected in series such that the first inverter means inverts the received sleep signal and the second inverter means restores the inverted sleep signal to a logic state of the originally received sleep signal, wherein the means responsive to the received sleep signal for switching the external supply voltage comprises a PMOS power switch, the switch cell circuit further including means for driving the PMOS power switch with multiple gate voltages to provide a multi-stage power-up sequence for the integrated circuit, and wherein the gate driving means comprises modified inverter circuit including a PMOS inverter switch, an NMOS inverter switch, and a diode connected in series between a logic high voltage plane and a logic common voltage plane, a bypass switch is provided in parallel with the diode, the inverted sleep signal output from the first inverter means is input to the modified inverter circuit to drive the PMOS and NMOS inverter switches, a circuit node formed between the series PMOS and NMOS inverter switches provides the output of the modified inverter circuit for driving the gate of the PMOS power switch.

18. A method of selectively decoupling and coupling an external supply voltage to an integrated circuit chip, the method comprising:

asserting a sleep signal;

propagating the asserted sleep signal to a plurality of sequentially linked switch cells;

buffering the asserted sleep signal in each sequentially linked switch cell such that the asserted sleep signal is returned from a last of said sequentially linked switch cells after a cumulative buffering delay;

decoupling the external supply voltage from an internal supply voltage plane in each of the plurality of sequentially linked switch cells in a sequential manner in response to the asserted sleep signal;

asserting a pull down signal after the asserted sleep signal is returned from the last sequentially linked switch cell;

propagating the asserted pull down signal to the sequentially linked switch cells;

coupling the internal supply voltage plane to a logic common voltage plane on the integrated circuit chip in each sequentially linked switch cell in response to the asserted pull down signal;

deasserting the pull down switch signal;

propagating the deasserted pull down switch signal to the sequentially linked switch cells such that the deasserted pull down signal is returned from the last sequentially linked switch cell after a propagation delay;

decoupling the internal supply voltage plane from the logic common voltage plane of the integrated circuit chip in each of the plurality of sequentially linked switch cells in a sequential manner in response to the deasserted pull down signal;

deasserting the sleep signal after the deasserted pull down signal is received from the last sequentially linked switch cell;

propagating the deasserted sleep signal to the sequentially linked switch cells; and coupling the external supply voltage to the internal supply voltage plane in each of the plurality of sequentially linked switch cells in a sequential manner in response to the deasserted sleep signal.

19. The method of claim 18 wherein coupling the external supply voltage to the internal supply voltage plane comprises providing a first level of power to the integrated circuit chip in response to the deasserted sleep signal, and the method further comprising propagating a subsequent deasserted sleep signal to the sequentially linked switch cells after the prior deasserted sleep signal has been propagated through the sequentially linked switch cells, and providing a second level of power to the integrated circuit chip in response to the subsequent deasserted sleep signal.

20. A switch cell circuit for selectively coupling an external supply voltage to an integrated circuit chip, the switch cell circuit comprising:

a power circuit for coupling the external supply voltage to the integrated circuit chip; and an inverter circuit driving the power circuit, the inverter circuit providing a multi-level voltage signal to the power circuit such that the power circuit takes on one of a plurality of states corresponding to a particular stage of a multi-stage power-up sequence, wherein the power circuit comprises a PMOS transistor having a source coupled to the external supply voltage, a drain coupled to the integrated circuit chip, and a gate driven by an output of the inverter circuit, and wherein the inverter circuit comprises a PMOS transistor, an NMOS transistor, and a gate voltage modification diode connected in series between the external supply voltage and a logic common voltage plane, a circuit node formed between the PMOS and NMOS transistors providing an output of the inverter circuit for driving the gate of the PMOS transistor in the power circuit.

21. The switch cell circuit of claim 20 wherein in a first state the power circuit is substantially non-conductive, in a second state the power circuit couples a first voltage level to the integrated circuit chip, and in a third state the power circuit couples a second voltage level to the integrated circuit chip.

22. The switch cell circuit of claim 20 wherein the inverter circuit further includes a bypass switch in parallel with the gate voltage modification diode, such that the gate voltage modification diode is bypassed by closing the bypass switch, thereby modifying the gate voltage applied to the PMOS transistor in the inverter circuit.

* * * * *